(12) United States Patent  
Imken et al.

(10) Patent No.: US 7,871,150 B2
(45) Date of Patent: Jan. 18, 2011

(54) FLEXIBLE CIRCUITS HAVING INK-RESISTANT COVERCOATS

(75) Inventors: Ronald L. Imken, Round Rock, TX (US); Thach G. Truong, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 1036 days.

(21) Appl. No.: 11/624,638

(22) Filed: Jan. 18, 2007

(65) Prior Publication Data

US 2007/0165076 A1 Jul. 19, 2007

(51) Int. Cl.
*B41J 2/14* (2006.01)
*B41J 2/16* (2006.01)

(52) U.S. Cl. .......................... 347/50; 347/58
(58) Field of Classification Search .................. 347/50, 347/57–59, 71, 85–86
See application file for complete search history.

(56) References Cited

U.S. PATENT DOCUMENTS

| 5,874,974 | A | 2/1999 | Courian et al. |
| 5,924,198 | A | 7/1999 | Swanson et al. |
| 6,294,270 | B1 | 9/2001 | Clough |
| 6,320,137 | B1 | 11/2001 | Bonser et al. |
| 6,423,367 | B2 | 7/2002 | Clough |
| 6,489,042 | B2 | 12/2002 | Imken et al. |
| 6,800,169 | B2 * | 10/2004 | Liu et al. ................ 156/292 |
| 6,860,592 | B2 | 3/2005 | Chen et al. |
| 7,629,537 | B2 * | 12/2009 | Ice ........................ 174/254 |
| 2005/0126697 | A1 | 6/2005 | Kuczynski |
| 2007/0064054 | A1 | 3/2007 | Hayden et al. |

FOREIGN PATENT DOCUMENTS

| JP | 2001-146583 | 5/2001 |
| WO | WO 09855316 | 12/1998 |

OTHER PUBLICATIONS

King Industries, "New Additives for Coatings", 2 pages, publicly available as of Oct. 24, 2005.
King Industries, "Nacure Super Catalysts for Epoxy Systems", 2 pages, publicly available as of Oct. 24, 2005.
Rogers Corporation, Article, "R/flex 8080LP3 Liquid Photoimageable Covercoat", 12 pages, Oct. 2005.
Daicel Chemical Industries, Ltd., Datasheet for EPOFRIEND product, 5 pages, (date unknown but believed to be prior to May 9, 2002).

* cited by examiner

*Primary Examiner*—Thinh H Nguyen
(74) *Attorney, Agent, or Firm*—Malania G. Gover

(57) ABSTRACT

A circuit article for use with an inkjet printer pen. The circuit article comprises a flexible circuit having a plurality of conductive traces disposed on a dielectric film, an adhesive film disposed adjacent the dielectric film of the flexible circuit, and a carrier film disposed adjacent the first adhesive film, opposite of the flexible circuit. The adhesive film is derived from a cross-linkable precursor comprising an epoxidized aromatic-diene block copolymer and a thermal-curing agent.

22 Claims, 4 Drawing Sheets

FLEXIBLE CIRCUITS HAVING INK-RESISTANT COVERCOATS

The present application claims priority to pending U.S. patent application Ser. No. 11/334,892, filed Jan. 19, 2006.

FIELD

The present disclosure relates to flexible circuits for use with inkjet printing systems. In particular, the present disclosure relates to ink-resistant covercoats for flexible circuits of inkjet printer pens used with inkjet printing systems.

BACKGROUND

Inkjet printer pens are cartridges installed in inkjet printing systems for storing and dispensing ink onto recording media (e.g., paper). An inkjet printer pen typically includes a pen body for retaining the ink, a printer chip disposed on the pen body for dispensing the ink, and a flexible circuit attached to the body for electrically interconnecting the printing system and the printer chip. During a printing operation, the printing system transmits an electrical signal through the flexible circuit to the printer chip. The signal causes the ink to eject from the pen body onto the recording medium based on the jetting technique used. For example, thermal bubble jetting uses a resistive component that heats up when the electrical signal is received from the printing system. This causes a portion of the ink to volatilize to create a bubble that ejects ink from the pen body. Alternatively, piezoelectric jetting uses a transducer that mechanically ejects ink from the pen body when the electrical signal is received.

The bond between the flexible circuit and the pen body of the printer pen is desirably strong and robust enough to withstand exposure to inkjet inks over extended periods of use. If the bond is attacked by the ink, the flexible circuit may delaminate from the pen body. Additionally, if the conductive components of the flexible circuit are not completely encapsulated with an ink-resistant material, the ink, which typically contains corrosive solvents, may chemically attack the conductive components. This may result in electrical shorts and poor signals, which can render the printer pen inoperable.

SUMMARY

At least one aspect of the present invention relates to a circuit article for use with an inkjet printer pen, and a method of forming the circuit article. The circuit article includes an adhesive disposed between a flexible circuit and a carrier film, where the adhesive is derived from a cross-linkable precursor that includes an epoxidized aromatic-diene block copolymer and a thermal-curing agent. The adhesive and the carrier film protect conductive traces of the flexible circuit from exposure to corrosive ink.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale. Like reference numbers have been used throughout the figures to denote like parts.

DETAILED DESCRIPTION

Figure 1:
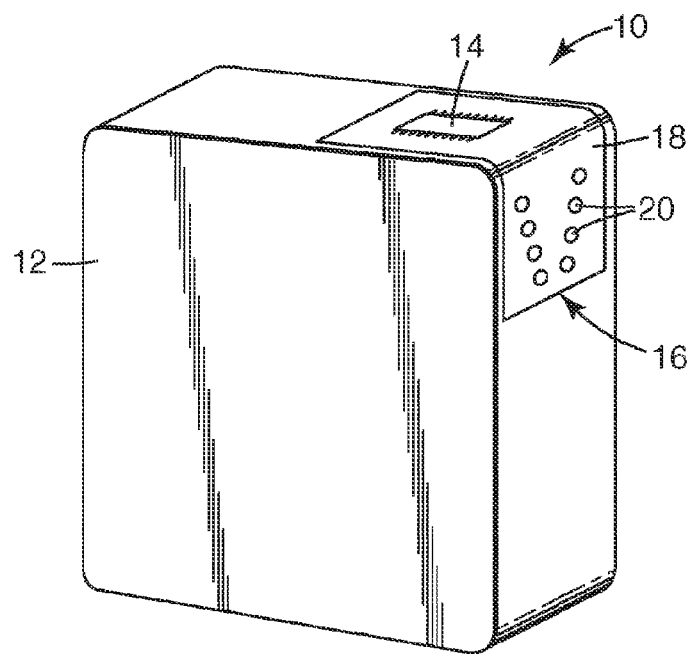
FIG. 1 is a perspective view of an inkjet printer pen.

FIG. 1 is a perspective view of inkjet printer pen 10, which is a printer pen suitable for use with inkjet printing systems to eject ink onto recording media. Inkjet printer pen 10 includes pen body 12, printer chip 14, and flexible circuit 16. Pen body 12 is a metal or plastic cartridge for retaining and ejecting ink. Printer chip 14 is an electronic chip secured to pen body 12 for ejecting ink from pen body 12. Printer chip 14 may be configured to eject ink in a variety of manners, such as thermal bubble jetting and piezoelectric jetting techniques. While a single printer chip 14 is shown in FIG. 1, printer pen 10 may alternatively include multiple printer chips 14 as necessary for the given configuration.

Flexible circuit 16 is attached to pen body 12, and includes exterior surface 18 and contact pads 20. As shown, contact pads 20 are available through exterior surface 18. Contact pads 20 are the portions of printer pen 10 that provide electrical communication with the printing system (not shown) when printer pen 10 is installed in the printing system. Contact pads 20 are also electrically connected to printer chip 14. As such, during a printing operation the printing system may transmit printing signals through contact pads 20 to printer chip 14. In an alternative embodiment, flexible circuit 16 may not include contact pads 20. In this embodiment, flexible circuit 16 may be electrically connected (e.g., soldered) to an external circuit board.

As discussed below, flexible circuit 16 is secured to an ink-resistant covercoat (not shown in FIG. 1), which is disposed between pen body 12 and flexible circuit 16. The ink-resistant covercoat reduces the risk of ink exposure to internal corrosion-vulnerable components of flexible circuit 16.

Pen body 12 may include a variety of dimensional designs to coordinate with different printing systems. In alternative embodiments to that shown in FIG. 1, pen body 12 may include an ink dispensing mechanism that is removable from the ink reservoir. Alternative embodiments may not have blind vias and/or contact pads accessible from the side of the flexible circuit opposite the conductive traces. Such designs allow the ink dispensing mechanism to be used with replaceable ink reservoirs. In these embodiments, flexible circuit 16 is adhered to the ink dispensing mechanism that is not replaced, and may be subjected to ink exposure over extended periods of use. The term "pen body" is intended to include both integral designs, such as pen body 12 shown in FIG. 1, and designs having multiple removable components.

Figure 2:
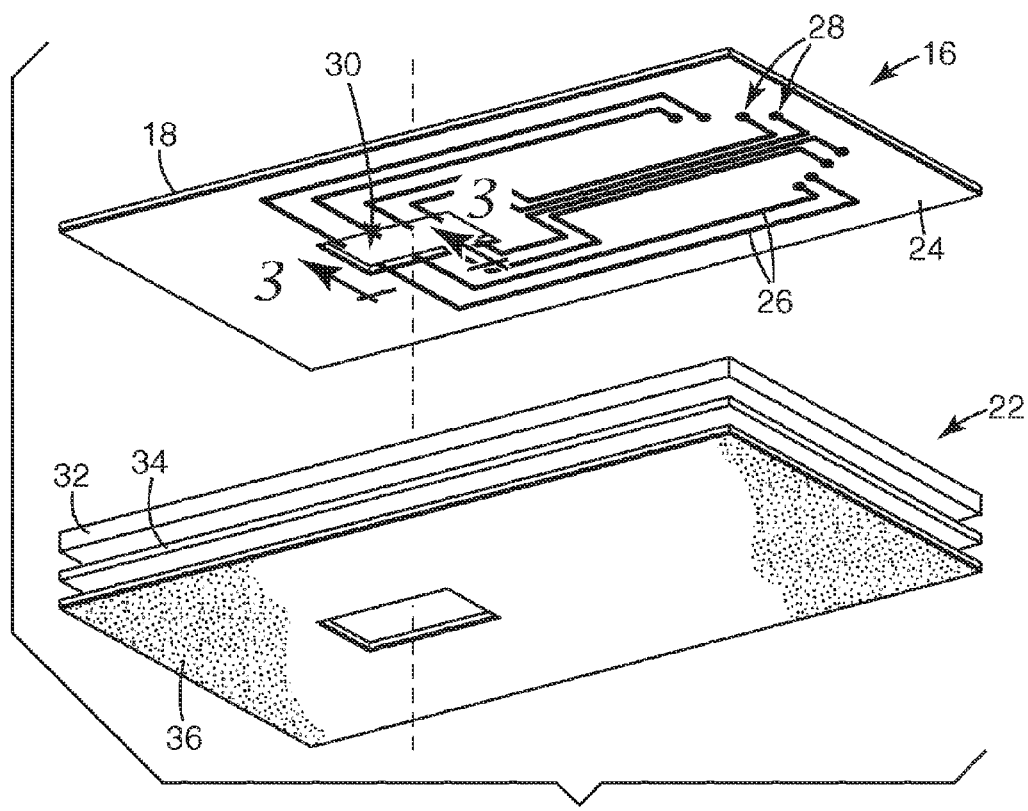
FIG. 2 is an exploded view showing a rear portion of a flexible circuit and a covercoat, which are removed from the inkjet printer pen.

FIG. 2 is an exploded view showing a rear portion of flexible circuit 16 and covercoat 22, which are removed from printer pen 10. As shown, flexible circuit 16 further includes interior surface 24, a plurality of conductive traces 26, blind vias 28, and chip opening 30. Conductive traces 26 are formed on interior surface 24 to connect to contact pads 20 (not shown in FIG. 2) at blind vias 28, and to connect to printing chip 14 (not shown in FIG. 2) at chip opening 30. Thus, conductive traces 26 electrically interconnect printing chip 14 and contact pads 20 through blind vias 28. This allows the printing system to transmit electrical signals to printing chip 14.

Covercoat 22 is an ink-resistant, multi-layer component that includes adhesive film 32, carrier film 34, and tie layer 36. Covercoat 22 protects conductive traces 26 of flexible circuit 16 from attack by the corrosive ink while also providing a strong adhesive bond between flexible circuit 16 and pen body 12. This preserves the integrity of flexible circuit 16, which correspondingly increases the product life of printer pen 10.

Figure 3A:
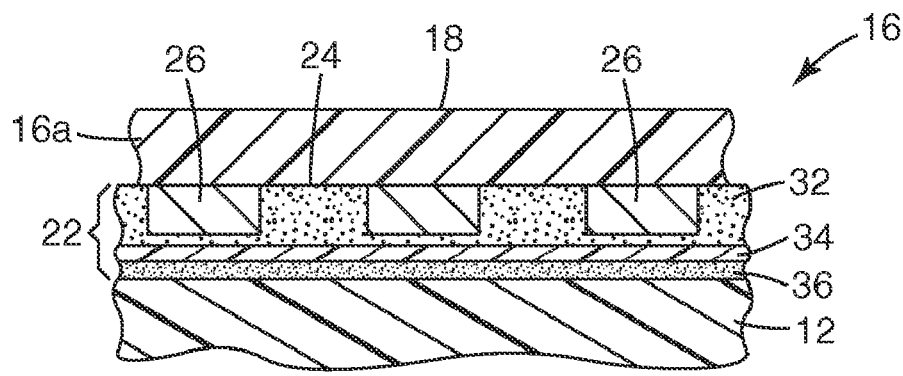
FIG. 3A is a sectional view of section 3-3 taken in FIG. 2, showing the interlayer orientations between a pen body, the flexible circuit, and the covercoat.

FIG. 3A is a sectional view of section 3-3 taken in FIG. 2, showing the interlayer orientation between pen body 12, flexible circuit 16, and covercoat 22. Flexible circuit 16 includes dielectric layer 16a (having exterior surface 18 and interior surface 24), upon which conductive traces 26 are disposed. Dielectric layer 16a protects conductive traces 26 from abrasive, chemical, and thermal conditions that are external to flexible circuit 16 from the direction of exterior surface 18. Suitable materials for dielectric layer 16a include flexible polymeric film-forming materials, such as polyimides, poly (ethylene naphthalate), poly(ethylene terephthalate), and combinations thereof. Interior surface 24 of dielectric layer 16a may also be treated to increase the adhesion between dielectric layer 16a and adhesive film 32. Suitable treatment techniques include flash lamp treatments, corona treatments, plasma treatments, flame treatments, chemical treatments (e.g., oxidizers and etchants), and combinations thereof.

Adhesive film 32 is bound to interior surface 24 of flexible circuit 16 such that conductive traces 26 are encapsulated and insulated between dielectric layer 16a and adhesive film 32. This reduces the risk of ink exposure to conductive traces 26. Additionally, the encapsulation reduces the amount of gold plating required to manufacture flexible circuit 16. For example, gold plating may be limited to contact pads 20, which accordingly reduces material costs for manufacturing flexible circuit 16. Adhesive film 32 compositionally includes a cross-linked adhesive that is flexible and provides good resistance to corrosive inks due to its hydrophobic and non-plasticized nature. As discussed below, the cross-linked adhesive also provides good adhesion to polyimide-based films (e.g., dielectric layer 16a and carrier film 34) due to reactions with moieties of the polyimide surfaces.

Carrier film 34 is a polymeric film having one or more layers, and which provides additional protection against ink exposure. Suitable materials for carrier film 34 include flexible polymeric film-forming materials, such as polyimides, poly(ethylene naphthalate), poly(ethylene terephthalate), polyaramids, polyetherimides, polycarbonates, ethylene-chlorotrifluoroethylenes, polyethersulfones, polyethersulfones, polyvinylidene fluorides, polyfluorinated ethylene-propylenes, perfluoroalkoxies, polysulfones, polyethylenes, polypropylenes, polystyrenes, and combinations thereof. Examples of particularly suitable materials for carrier film 34 include polyimides, poly(ethylene naphthalate), poly(ethylene terephthalate), polyaramids, and combinations thereof.

Each surface of carrier film 34 may be treated to increase the adhesion between adhesive film 32 and carrier film 34. Suitable treatment techniques include flash lamp treatments, corona treatments, plasma treatments, flame treatments, chemical treatments (e.g., oxidizers and etchants), and combinations thereof.

Tie layer 36 is a second adhesive film for securing carrier film 34 to pen body 12. Suitable materials for tie layer 36 include one or more adhesives that are melt-flowable, pressure sensitive, or a combination thereof. Examples of suitable materials for tie layer 36 include acrylates, urethanes, silicones, epoxies, rubber based adhesives (e.g., natural rubbers, polyisoprenes, polyisobutylenes, butyl rubbers, ethylene vinyl acetates, and thermoplastic rubbers), and combinations thereof. Tie layer 36 also desirably provides good adhesion to pen body 12 and carrier film 34, and is ink resistant to reduce the risk of interlayer delamination.

Figure 3B:
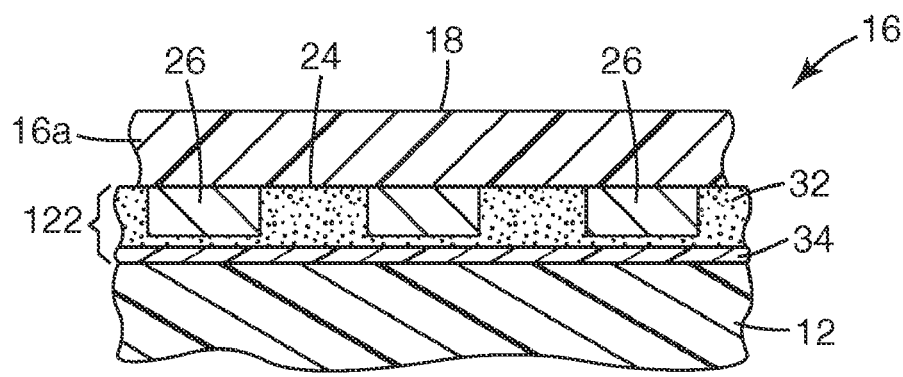
FIG. 3B is a first alternative embodiment of a sectional view of section 3-3 taken in FIG. 2, in which the covercoat does not include a tie layer.

FIG. 3B is an alternative interlayer orientation, compared to that shown in FIG. 3A, of a sectional view of section 3-3 taken in FIG. 2. As shown in FIG. 3B, covercoat 122 is used in place of covercoat 22, where covercoat 122 is similar to cover coat 22, but does not include tie layer 36. As such, covercoat 122 does not directly bond to pen body 12, and flexible circuit 16/covercoat 122 may be hot-staked or otherwise mechanically retained against pen body 12. In this embodiment, covercoat 122 also protects conductive traces 26 of flexible circuit 16 from attack by the corrosive ink.

Figure 3C:
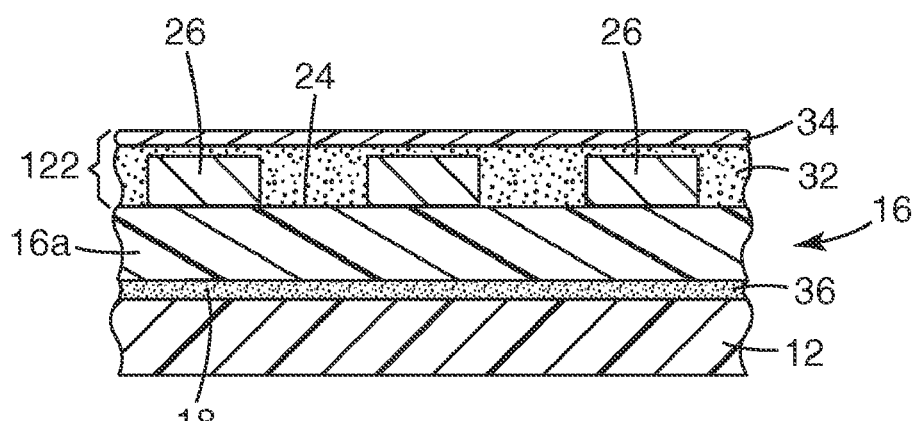
FIG. 3C is a second alternative embodiment of a sectional view of section 3-3 taken in FIG. 2, in which the flexible circuit and the covercoat are inverted.

FIG. 3C is an additional alternative interlayer orientation, compared to that shown in FIGS. 3A and 3B, of a sectional view of section 3-3 taken in FIG. 2. As shown in FIG. 3C, flexible circuit 16 and covercoat 122 are inverted relative to the orientations shown in FIGS. 3A and 3B. As such, surface 18 of dielectric layer 16a is bonded to pen body 12 via tie layer 36. Covercoat 122 also protects conductive traces 26 of flexible circuit 16 from attack by the corrosive ink. In addition, carrier film 34 is the external film in this embodiment, thereby providing protection from abrasive, chemical, and thermal conditions that are external to carrier film 34. In this embodiment, blind vias 28 (not shown) for contact pads 20 (not shown) extend through adhesive film 32 and carrier film 34 instead of dielectric layer 16a.

In an alternative arrangement to that shown in FIG. 3C, tie layer 36 may be omitted. In this case, dielectric layer 16a is directly disposed against pen body 12. Flexible circuit 16/covercoat 122 may then be hot-staked or otherwise mechanically retained against pen body 12.

With respect to all of the embodiments shown above in FIGS. 3A-3C, adhesive film 32 desirably has a layer thickness that encapsulates conductive traces 26 and provides good adhesion between flexible circuit 16 and carrier film 34. The layer thicknesses of adhesive film 32 are generally dependent on the layer thicknesses of conductive traces 26, which may range from about 1 micrometer (e.g., for non-inkjet applications) to about 100 micrometers. Typical layer thicknesses for conductive traces of commercial inkjet printer cartridges range from about 25 micrometers to about 50 micrometers. Suitable layer thicknesses for adhesive film 32 are typically at least about 1.5 times the layer thickness of conductive traces 26, with particularly suitable layer thicknesses being at least about 2 times the layer thickness of conductive traces 26. Examples of suitable layer thicknesses for adhesive film 32 range from about 1 micrometer to about 300 micrometers, with particularly suitable layer thicknesses ranging from about 50 micrometers to about 100 micrometers. Similarly, examples of suitable layer thicknesses for each of carrier film 34 and tie layer 36 range from about 10 micrometers to about 100 micrometers.

The cross-linked adhesive of adhesive film 32 is derived from a "cross-linkable precursor" that includes an epoxidized aromatic-diene (EAD) block copolymer and a thermal-curing agent. Suitable concentrations of the EAD block copolymer in the cross-linkable precursor range from about 75.0% to about 99.9%, with particularly suitable concentrations ranging from about 95.0% to about 99.9%, based on the entire weight of the cross-linkable precursor. Suitable concentrations of the thermal-curing agent in the cross-linkable precursor range from about 0.1% to about 25.0%, with particularly suitable concentrations ranging from about 0.1% to about 5.0%, based on the entire weight of the cross-linkable precursor. All concentration percentages discussed herein refer to weight percents.

The EAD block copolymer includes (i) an aromatic polymer block derived from polymerization of an aromatic vinyl compound, and (ii) a diene polymer block derived from polymerization of a second compound having one or more conjugated double bonds, where the polymer backbone double bonds are at least partially epoxidized. Suitable copolymerization weight ratios of the aromatic vinyl compound with respect to the second compound range from about 20:80 to about 70:30, with particularly suitable copolymerization weight ratios ranging from about 30:70 to about 50:50, and with an even more particularly suitable copolymerization weight ratio of about 40:60.

Suitable number average molecular weights ($M_n$) of the EAD block copolymer range from about 5,000 to about 600,000, with particularly suitable number average molecular weights ranging from about 10,000 to about 500,000. Suitable molecular weight distributions (i.e., the ratio $M_w/M_n$) of a weight average molecular weight ($M_w$) to a number average molecular weight) include those less than about 10. The molecular structure of the EAD block copolymer may be linear, branched, radial types, and combinations thereof.

Examples of suitable aromatic vinyl compounds for forming the aromatic polymer block include styrene, alpha-methylstyrene, vinyl toluene, p-tert-butylstyrene, divinylbenzene, p-methylstyrene, 4n-propylstyrene, 2,4-dimethylstyrene, 3,5-diethylstyrene, 1,1-diphenyl-styrene, 2,4,6-trimethyl styrene, 4-cyclohexylstyrene, 3-methyl-5-n-hexyl styrene, and combinations thereof. An example of a particularly aromatic vinyl compound for forming the aromatic polymer block includes styrene.

Examples of suitable compounds for forming the diene polymer block include compounds having conjugated double bonds, such as butadiene, isoprene, 1,3-pentadiene, 2,3-dimethyl-1,3-butadiene, piperylene, 3-butyl-1,3-octadiene, 1-phenyl-1,3-butadiene, 1,3-octadiene, 4-ethyl-1,3-hexadiene, and combinations thereof. Examples of particularly suitable compounds for forming the diene polymer block include butadiene, isoprene, piperylene, and combinations thereof. As discussed above, the polymer backbone double bonds of the diene polymer block are at least partially epoxidized. An example of a backbone double bond of a butadiene polymer block being epoxidized is shown in the following representation:

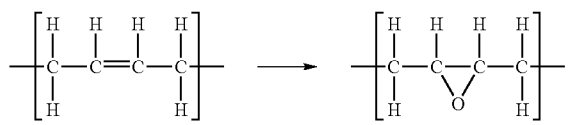

Examples of suitable epoxy equivalent weights for the EAD block copolymer range from about 100 to about 2,200, with particularly suitable epoxy equivalent weights ranging from about 100 to about 1,300.

The EAD block copolymer can be represented by configurations such as $(A-B)_xA$, $(B-A)_x$, and $(A-B)_4Si$, wherein A is the aromatic polymer block, B is the diene polymer block, and x is the number of A-B groups in the block copolymer. Unsaturated bonds remaining in the epoxidized styrene-diene block copolymer may be partially or fully hydrogenated. Alternatively, partial hydrogenation may precede epoxidation of the diene polymer block. Examples of suitable EAD block copolymers include hydrogenated and non-hydrogenated epoxidized styrene-butadiene block copolymers, which are commercially available under the trade designations "EPOFRIEND AT-501", "EPOFRIEND A1020", "EPOFRIEND A1010", and "EPOFRIEND A1005" from Daicel Chemical Industries LTD, Osaka, Japan.

Suitable thermal-curing agents for cross-linking the EAD block copolymer include agents suitable for cross-linking epoxy-functional compounds, and which are thermally stable at temperatures at which mixing of the cross-linkable precursor takes place. Thermal-curing agents are desirable for initiating the cross-linking of the EAD block copolymer because carrier film 34 may inhibit the transmission of ultraviolet radiation, electron beam radiation, or other types of radiation required for photoinitiators. As such, carrier film 34 would otherwise reduce or prevent photo-initiated cross-linking of the EAD block copolymer.

The thermal-curing agent is also desirably selected to provide a moderate initiation temperature, which is high enough to prevent premature cross-linking, but also low enough to prevent exposing flexible circuit 16 and carrier film 34 to excess temperatures. Such excess temperatures may degrade the materials of flexible circuit 16 and carrier film 34. Examples of suitable initiation temperatures for the thermal-cure agents range from about 60° C. to about 150° C., with particularly suitable initiation temperatures ranging from about 60° C. to about 130° C., and even more particularly suitable initiation temperatures ranging from about 70° C. to about 90° C. It is noted, however, that thermal-curing agents that provide for moderate initiation temperatures may also be initiated at higher temperatures to increase the cross-linking reaction rate if desired.

Examples of suitable thermal-curing agents for use in the cross-linkable precursor include aliphatic and aromatic primary and secondary amines (e.g., di(4-aminophenyl)sulfone, di(4-aminophenyl)ether, fluorene diamines such as 9,9-bis (aminophenyl)fluorine, and 2,2-bis-(4-aminophenyl)propane), aliphatic and aromatic tertiary amines (e.g., dimethylaminopropylamine, and imidazoles such as methylimidiazole and pyridine), quaternary ammonium salts (e.g., pyridinium salts such as N-methyl-4-picolinium hexafluorophosphate), sulfoninum salts, quartemary hexafluoroantimonate ($SBF_6$) salts, daryliodonium hexafluoroantimonate salts, amine salts of triflic acid, boron trifluoride complexes (e.g., $BF_3.Et2O$ and $BF_3.H_2C_2H_5OH$), hydrazines (e.g., adipohydrazine), guanidines (e.g., tetramethylguanidine and dicyandiamide/cyanoguanimide), compounds containing two or more carboxylic acid groups, compounds containing one or more carboxylic acid anhydride groups, and combinations thereof. The thermal-curing agent may also include accelerators (e.g., imidazoles) and catalysts (e.g., pyridinium; quinolinium; indolinium; alkyl, aryl, and alkylaryl ammonium salts; alkyl, aryl and alkylaryl phosphonium salts; and combinations thereof). Examples of suitable commercially available thermal-curing agents include those under the trade designations "NACURE XC-7231", "NACURE A233", and "K-PURE TAG-2678", all of which are commercially available from King Industries, Inc., Norwalk, Conn.

In another embodiment of the invention, a dual curative system, which uses a free radical curative in addition to the cationic thermal curative, may be used. If the adhesive used to attach the covercoat is exposed to high temperatures, e.g., during a lamination process, the high heat may soften the adhesive to an extent that moisture liberated from the polyimide circuit and polyimide covercoat induce bubble formation in the adhesive. By using a secondary free radical curative in the adhesive, additional polymer crosslinking is effected, typically through available vinyl groups in the butadiene phase of the styrene-butadiene polymer. These reactive vinyl groups remain in the butadiene segments after epoxidization and are, therefore, available for crosslinking by a free radical mechanism. This additional crosslinking increases the modulus of the adhesive, inhibiting the formation of moisture-induced bubbles in the adhesive.

Suitable free radical curatives include, but are not limited to, peroxide curatives such as Dicumyl Peroxide, such as those available under the trade designation LUPEROX DCP from Arkema, Inc., Philadelphia, Pa., or DICUP from GEO Specialty Chemicals, Lafayette, Ind.; 2,5,-Dimethyl-2,5 BIS (Tert-Butyl Peroxy) Hexyne-3, such as those available under the trade designation LUPEROX 130 from Arkema, Inc., or TRIGONOX 145 from Akzo Nobel Polymer Chemicals, Chicago, Ill.; Di-Tert-Butyl Peroxide such as those available under the trade designation TRIGONOX B from Akzo Nobel Polymer Chemicals; 2,5,-Dimethyl-2,5 BIS (Tert-Butyl Peroxy) Hexane, such as those available under the trade designation LUPEROX 101 from Arkema, Inc., or TRIGONOX 101 from Akzo Nobel Polymer Chemicals; Tert-Butyl Cumyl Peroxide such as those available under the trade designation LUPEROX 801 from Arkema, Inc., or TRIGONOX T from Akzo Nobel Polymer Chemicals; BIS(Tert-Butyl Peroxy Isopropyl) Benzene such as those available under the trade designation LUPEROX F from Arkema, Inc., or PERKADOX 14 from Akzo Nobel Polymer Chemicals, or VULCUP from GEO Specialty Chemicals; 4,4-Di-Tert-Butyl Peroxy N-Butyl Valerate such as those available under the trade designation LUPEROX 230 from Arkema, Inc., or TRIGONOX 17 from Akzo Nobel Polymer Chemicals; and 1,1-Di-Tert-Butyl Peroxy-3,3,5-Trimethylcyclohexane such as those available under the trade designation LUPEROX 231 from Arkema, Inc., or TRIGONOX 29 from Akzo Nobel Polymer Chemicals.

Suitable amounts of free radical curatives range from 0.05 wt % to 5 wt %. Typical cure temperatures for these free radical curatives typically range from about 150° C. to about 195° C., but temperatures can be increased for faster cures.

The cross-linkable precursor may also include additional materials to modify other physical characteristics. Examples of suitable additional materials include stabilizers (e.g., ultraviolet, heat, and oxidation stabilizers), thixotropic agents, pigments, plasticizers, fillers (e.g., silica and other micro- and nanoparticles), reinforcing materials, tackifiers, polyphenylene ethers, epoxy-containing reactive prepolymers and diluents, and polyols. Examples of suitable polyphenylene ethers, epoxy-containing reactive prepolymers and diluents, and polyols are disclosed in Clough et al., U.S. Pat. No. 6,294,270.

The cross-linkable precursor may be formed by mixing the components (e.g., the EPD block copolymer, the thermal-cure agent, and any additional materials). This may be performed with the use of a solvent (e.g., ethyl acetate and/or toluene) to substantially form a "precursor solution". Suitable concentrations of the cross-linkable precursor in the precursor solution range from about 5% to about 90%, with particularly suitable concentrations of the cross-linkable precursor in the precursor solution ranging from about 5% to about 40%, based on the entire weight of the precursor solution. The mixing (e.g., roller and impeller mixing) is desirably performed at low enough temperatures to prevent premature thermal cross-linking. Depending on the solubility of the materials in the solvent, the mixing may require several days to substantially form a solution. The resulting precursor solution, which contains the cross-linkable precursor and the solvent, may then be filtered with a filter, such as a 20-micrometer absolute filter cartridge, to remove large particles and oligomers.

Figure 4:
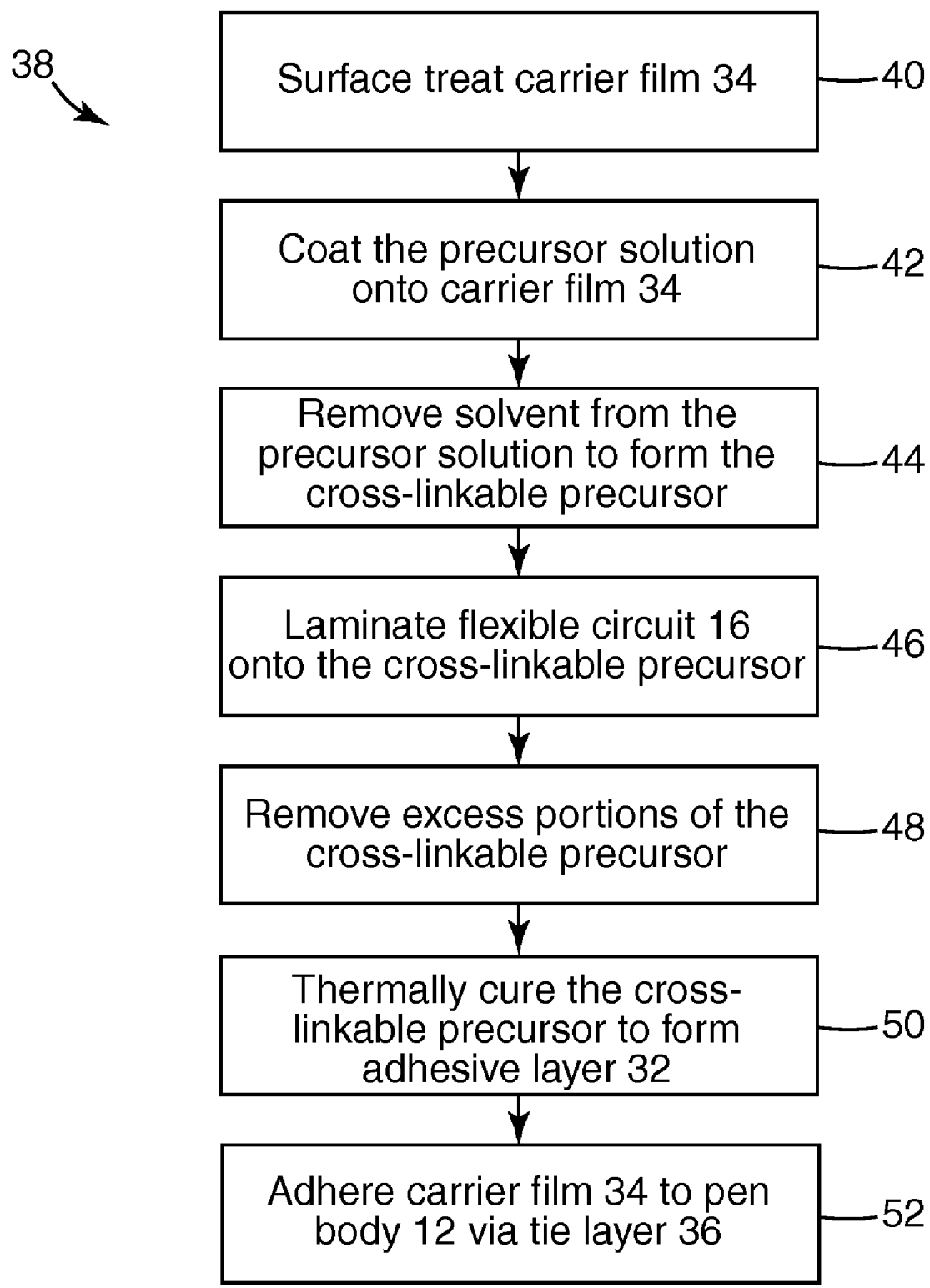
FIG. 4 is a flow diagram showing a method for forming the flexible circuit and the bonding component for use with the inkjet printer pen.

FIG. 4 is a flow diagram showing a method for forming flexible circuit 16 and covercoat 22 for use with printer pen 10 (referred to as "method 38"). As shown, method 38 includes steps 40-52, which initially involves treating each surface of carrier film 34 to increase the adhesive properties of carrier film 34 (step 40). As discussed above, suitable treatment techniques include flash lamp treatments, corona treatments, plasma treatments, flame treatments, chemical treatments, and combinations thereof. The precursor solution (which will subsequently be used to form adhesive film 32) is then coated onto one of the surfaces of carrier film 34 (step 42). This may be performed with a variety of techniques, such as hand coating, knife coating, extrusion, and wet casting, and is desirably performed at low temperatures. Examples of suitable nitrogen corona treatment techniques are disclosed in PCT Patent Application No. PCT/US2005/023670.

The solvent of the precursor solution is then removed to provide the cross-linkable precursor coated on carrier film 34 (step 44). The solvent removal may be performed by exposing the precursor solution to room temperatures or mild heating for a sufficient time to substantially evaporate off the solvent. The temperature for vaporizing the solvent is desirably selected to be substantially below the initiation temperature of the thermal-curing agent. Examples of suitable drying conditions of a dry 63-micrometer layer thickness include a two-minute drying cycle at about 52° C. (about 125° F.) followed by a four-minute drying cycle at about 60° C. (about 140° F.). A temporary protective film (e.g., polyethylene) may then be placed over the cross-linkable precursor during storage and transportation.

Flexible circuit 16 is then laminated on the cross-linkable precursor, opposite from carrier film 34 (step 46). This involves tacking the cross-linkable precursor/carrier film 34 at several points to flexible circuit 16 with a hot probe (e.g., a soldering iron or heated tacking tool), such that conductive traces 26 are disposed against the cross-linkable precursor. The resulting multi-layer film is then compressed with a hot roll laminator (commercially available under the trade designation "XL120" Laminator from Western Magnum, El Segundo, Calif.) at a line speed ranging from about 15 centimeters/minute (cm/min) (about 6-inches/min) to about 45 cm/min (about 18-inches/min), at a temperature ranging from about 110° C. (about 230° F.) to about 121° C. (about 250° F.), and with a piston pressure ranging from about 310 kilopascals (about 45 pounds/inch2 (psi)) to about 415 kilopascals (about 60 psi).

Alternatively, the lamination may be performed with a press laminator, which involves a pair of heated platens that compresses cross-linkable precursor/carrier film 34 and flexible circuit 16 together. Suitable heating temperatures for the platens include those discussed above for the roll laminator.

Lamination forces the cross-linkable precursor to conform to the dimensions of interior surface 24 and conductive traces 26, thereby encapsulating and insulating conductive traces 26. Lamination is also desirably performed under vacuum conditions (e.g., less than about 0.1 Torr) to reduce air entrapment between flexible circuit 16 and the cross-linkable precursor. Depending on the thermal-curing agent used, the elevated lamination temperature may be high enough to initiate the thermal cross-linking of the cross-linkable precursor. As such, during the lamination process, the cross-linkable precursor may begin to cross link to form adhesive film 32.

During the lamination process, excess portions of the cross-linkable precursor are typically squeezed out of the lateral edges of flexible circuit 16 and carrier film 34. The excess portions may be removed with the use of a solvent before the cross-linkable precursor completely cross-links to form adhesive film 32 (step 48). This illustrates another benefit of using the thermal-curing agent. When flexible circuit 16 is laminated to the cross-linkable precursor and carrier film 34, the cross-linkable precursor may be induced to flow and encapsulate conductive traces 26 without producing substantial cure. This allows the excess portions of the cross-linkable precursor to be removed before the cross-linkable precursor completely cures, and increases the ease of removal of the excess portions.

The excess portions of the cross-linkable precursor may be removed with a solvent developer. A suitable commercially available solvent developer for performing this process includes the trade designated "PROBIMER 450M" Developer from Schmiedeskamp, Germany, which includes a series of solvent spray chambers and non-heated drying zones. The processing solvent exposure conditions may vary depending on the solvent selected, the spray pressure and temperature, the exposure time, and the layer thickness of adhesive layer 32. Examples of suitable processing conditions using the solvent developer include initially spraying the laminated film (having an initial cross-linkable precursor thickness of about 62-micrometers) with a solvent (e.g., ethylhexyl acetate) having a spray pressure of about one bar and a temperature of about 80° C., with an exposure time ranging from about 30 seconds to about two minutes. The laminated film may then be sprayed with a second solvent (e.g., 2-butyrolactone) having a spray pressure of one bar, with an exposure time ranging from about five seconds to about one minute. The laminated film may then be rinsed with water and dried. This results in a clean removal of the excess portions of the cross-linkable precursor, with substantially no undercutting.

The cross-linkable precursor is then fully cross-linked by exposing the cross-linkable precursor to the initiation temperature of the thermal-cure agent for a sufficient time to substantially complete the cross-linking (step 50). This provides adhesive film 32 adhered to flexible circuit 16 and carrier film 34. As discussed above, for films such as polyimide-based films, the cross-linkable precursor may also react with the surface moieties of the films, thereby increasing the adhesive strengths. Carrier film 34 may then be secured to pen body 12 of printer pen 10 by applying tie lay 36 either onto the exposed surface of carrier film 34 or onto the surface of pen body 12, and carrier film 34 is positioned onto tie layer 36 (step 52). Tie layer 36 may be applied as a hot melt adhesive or a pressure sensitive adhesive, thereby adhering carrier film 34 to pen body 12. The resulting circuit article is flexible and ink-resistant, that is secured to pen body 12 to provide an ink dispensing mechanism that may be used for extended periods of time.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following examples are on a weight basis, and all reagents used in the examples were obtained, or are available, from the chemical suppliers described below, or may be synthesized by conventional techniques.

Example 1 and Comparative Examples A-E

A circuit article of Example 1, having a flexible circuit and a corresponding covercoat adhered by an adhesive film, was prepared pursuant to the following procedure. An adhesive film precursor solution was prepared by combining 140 grams of an epoxidized styrene-butadiene block copolymer (commercially available under the trade designation "EPOFRIEND AT-501" from Daicel Chemical Industries LTD, Osaka, Japan), 1.4 grams of a quaternary hexafluoroantimonate salt (commercially available under the trade designation "NACURE XC-7231" from King Industries, Inc., Norwalk, Conn.), and 329 grams of 99% ethyl acetate solvent. The components were mixed on a roller mixer for 24 hours. The resulting solution was then pressure filtered at 415 kilopascals (60 psi) using a 20-micrometer absolute filter to produce a precursor solution that was substantially free of large contaminant particles, gels, and oligomers.

The adhesive precursor solution was then coated on an untreated 25 micrometer poly(ethylene naphthalate) film (commercially available under the trade designation "TEONEX Q51" PEN film from DuPont Teijin) using a hand-spread unit with a 381 micrometer (15 mil) coating gap. The coated film was allowed to flash off the ethyl acetate solvent at room temperature for one hour, followed by a 20 minute baking at 55° C. in a convection oven. This resulted in a PEN carrier film coated with the cross-linkable adhesive precursor.

The coated film was then laminated on an interdigitated test circuit such that the cross-linkable precursor was disposed against the conductive traces of the circuit. The interdigitated test circuit utilized conductive traces that had 75-micrometer widths, 75 micrometer spaces between traces, 35-micrometer thicknesses, and a 150-micrometer pitch. The lamination involved tacking the coated film at several points to the circuit with a hot probe, such that conductive traces of the circuit were disposed against the cross-linkable adhesive precursor. The resulting multi-layer film was then compressed with a hot roll laminator (commercially available under the trade designation "XL120" Laminator from Western Magnum, El Segundo, Calif.) at a line speed of 30-centimeters/minute (1 foot/minute), with a lamination temperature of 110° C. (230° F.), and with a piston pressure of 415 kilopascals (60 psi). A final cure of the cross-linkable adhesive precursor was achieved by baking the laminated film at 130° C. for 30 minutes to provide the circuit article of Example 1.

Comparative Example A was a circuit article having a hot-melt, ethyl-vinyl acetate (EVA) film overlaying a flexible circuit, as disclosed in Rohloff et al., PCT Publication No. WO98/55316. Comparative Example B was a circuit article having a photoimageable film overlaying a flexible circuit, as disclosed in Imken et al., U.S. Pat. No. 6,489,042. Comparative Example C was a circuit article having a polyimide film with a thermal-cure acrylic adhesive overlaying a flexible circuit, and which is commercially available under the trade designation "PYRALUX" from E. I. du Pont de Nemours and Company. Comparative Example D was a circuit article having a photoimageable screen print epoxy-acrylate film overlaying a flexible circuit, and which is commercially available under the trade designation "FLEX NPR-80/ID431" from Nippon Polytech Corporation, Japan. Comparative Example E was a circuit article having a screen print, thermal-cure, epoxy film overlaying a flexible circuit, and which is commercially available under the trade designation "CCR-232" from Asahi Shimbun Company, Japan.

The ink resistances of the circuit articles of Example 1 and Comparative Examples A-E were each measured with an electrified ink immersion test, which was performed with the following procedure. The circuit article was immersed in an ink environment (containing a solvent, pigment, electrolyte, and water) maintained at 70° C. A 30-volt bias was then applied between the neighboring parallel lines of the conductive traces. When placed in an ink environment, particularly at elevated temperature, the electrical bias accelerates the failure of materials covering the conductive traces. Performance is quantified by depicting the survival rate of a group of circuits over time. For the purpose of evaluating the circuit articles of Example 1 and Comparative Examples A-E, failure was defined as the time when current leakage between adjacent traces exceeded 10 microAmps. The electrified ink immersion test was performed on 10 circuit articles for each of Example 1 and Comparative Examples A-E. Table 1 provides the "mean time to failure" and the "longest time of survival" based on the 10-sample study.

TABLE 1

| Example | Mean Time of Failure (Hours) | Longest Time of Survival (Hours) |
| --- | --- | --- |
| Example 1 | 2338 | 3181 |
| Comparative Example A | 524 | 1113 |
| Comparative Example B | 315 | 557 |
| Comparative Example C | 23 | 31 |
| Comparative Example D | 5 | 17 |
| Comparative Example E | 7 | 11 |

The data in Table 1 illustrates the good ink resistance exhibited by the circuit articles of the present invention. As shown, the mean time to failure for the circuit article of Example 1 was at least than four times greater than the mean time to failures for the circuit articles of Comparative Examples A-E. to the first failure for the circuit article Example 1 occurred at 1907 hours.

Figure 5:
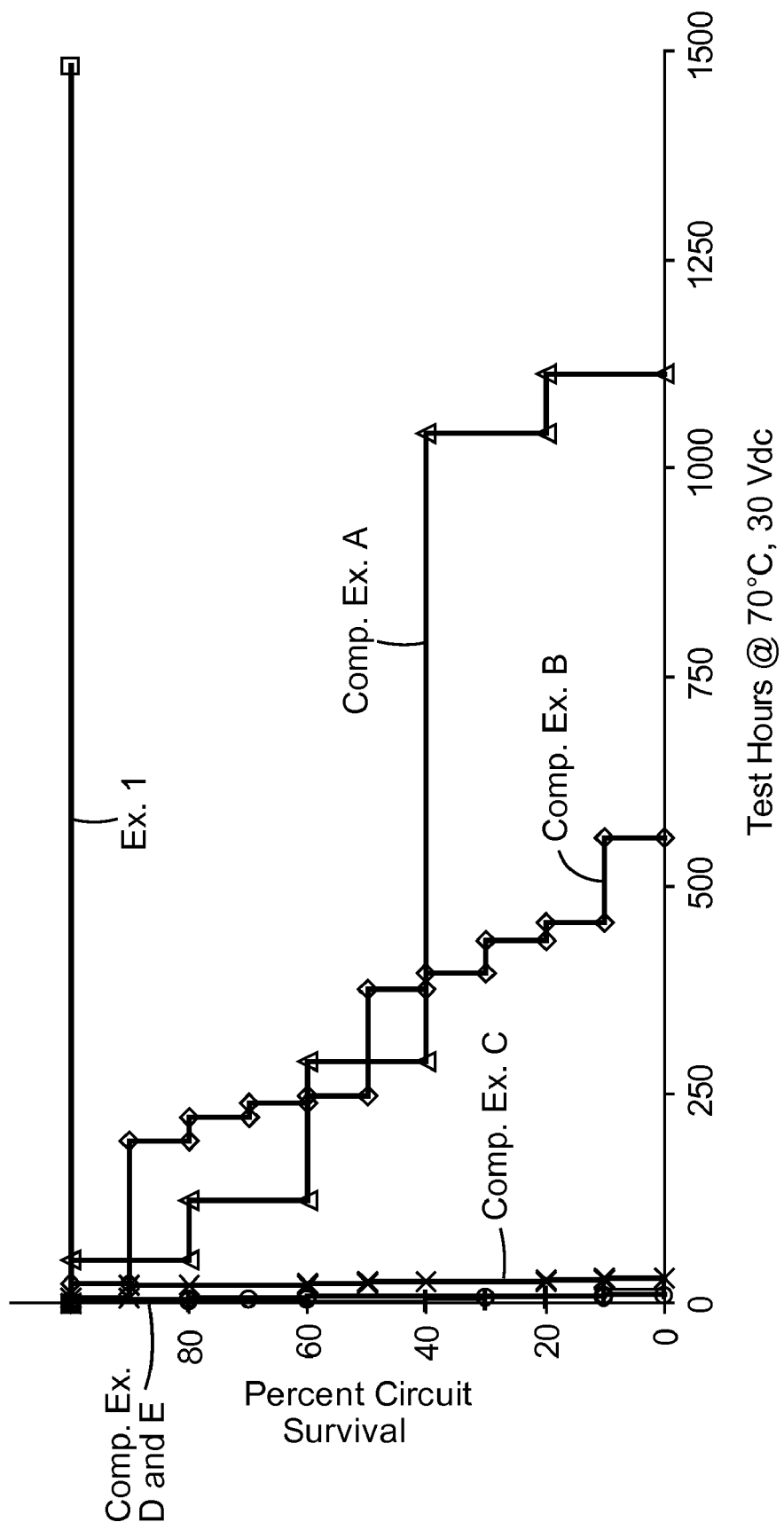
FIG. 5 is a graphical plot of an electrified ink immersion test for exemplary samples of the present invention and comparative examples.

FIG. 5 is a graphical plot of the percent circuit survival versus time (hours) for the circuit articles of Example 1 and Comparative Examples A-E. As shown, the circuit article of Example 1 retained about 100% survival beyond 1500 hours, which was significantly greater than the respective results of the circuit articles of Comparative Examples A-E. Accordingly, the circuit articles of the present invention exhibit good ink resistance for use with inkjet printer pens over extended periods of time.

Example 2

A circuit article of Example 2, having a flexible circuit and a corresponding covercoat adhered by an adhesive film, was prepared pursuant to the following procedure. A PEN carrier film coated with a cross-linkable adhesive precursor was prepared and laminated on an interdigitated test circuit pursuant to the procedure discussed above in Example 1. However, prior to the final cure, the excess portions of the cross-linkable precursor were removed by passing the circuit article of Example 2 through a solvent developer (trade designated "PROBIMER 450M" Developer from Schmiedeskamp). The circuit article was initially sprayed for one minute with ethylhexyl acetate having a spray pressure of one bar and a temperature of 80° C. The circuit article was then be sprayed for 15 seconds with 2-butyroactone having a spray pressure of one bar. The circuit article was then rinsed with water and dried.

The resulting article had a clean removal of the excess portions of the cross-linkable adhesive precursor, and showed substantially no undercutting of the PEN carrier film. As discussed above, the cross-linkable precursor may be thermally cured at a controlled rate. This allows the excess portions of the cross-linkable precursor to be removed before the cross-linkable adhesive precursor completely cures, and increases the ease of removal of the excess portions.

Example 3

A circuit article of Example 3, having a flexible circuit and a corresponding covercoat adhered by an adhesive film, was prepared in the same manner as Example 1 except that 1% dicumyl peroxide by weight was added to the cross-linkable adhesive precursor solution, the precursor solution was coated on a 25 micrometer polyimide film (commercially available under the trade designation UPILEX S from Ube Corporation, Japan) and the final cure of the cross-linkable adhesive precursor was achieved by baking the laminated film at 175° C. The baking was performed in a nitrogen environment to limit oxidation of the cross-linkable precursor using a ramp of 30 minutes from room temperature to 175° C. and a one hour hold at 175° C. All other steps of solution preparation, coating, drying, and lamination were the same as in Example 1. The circuit article of Example 3 was subsequently subjected to a platen press for about 2 seconds at 280° C. and 40 psi. No bubbles were observed in the adhesive layer.

A circuit article was prepared in the same manner as Example 3 except that the cross-linkable adhesive precursor solution was made without dicumyl peroxide curative. The adhesive formed bubbles from moisture in the polyimide films at temperatures as low as 240° C.

Examples 4 and 5

Adhesive films of Examples 4, suitable for adhering a flexible circuit to a corresponding covercoat to form a circuit article, were prepared pursuant to the following procedure. A cross-linkable adhesive precursor solution was prepared by combining 140 grams of an epoxidized styrene-butadiene block copolymer (commercially available under the trade designation "EPOFRIEND AT-501" from Daicel Chemical Industries LTD, Osaka, Japan), 0.7 grams of a quaternary hexafluoroantimonate salt (commercially available under the trade designation "NACURE XC-7231" from King Industries, Inc., Norwalk, Conn.), and 329 grams of 99% ethyl acetate solvent. The components were mixed on a roller mixer for 24 hours. The resulting solution was then pressure filtered at 415 kilopascals (60 psi) using a 20-micrometer absolute filter to produce a precursor solution that was substantially free of large contaminant particles, gels, and oligomers.

The adhesive precursor solution was then coated on a fluorocarbon coated polyimide film (commercially available under the trade designation KAPTON FN from DuPont Teijin) using a hand-spread unit with a 381 micrometer (15 mil) coating gap. The cross-linkable adhesive precursor was allowed to flash off the ethyl acetate solvent at room temperature for 24 hours. This resulted in a polyimide release film samples coated with the cross-linkable precursor. The cross-linkable precursor was then cured using the conditions indicated in Table 2.

Example 5 was made in the same manner as Example 4 except that 1% (based on polymer weight) dicumyl peroxide, available under the trade designation DICUP R from GEO Specialty Chemical was added to the cross-linkable adhesive precursor solution of Example 4. Again, the adhesive precursor was coated on polyimide release films and dried as in Example 4. The cross-linkable precursor was cured using the conditions shown in Table 2. The cured cross-linkable adhesive films were carefully separated from the polyimide release film so that free-standing films of the cured adhesive were obtained.

Samples of films from Examples 4 and 5 were subjected to the Tensile Test Method IPC-TM-650 Meth. 2.4.19, ASTM D-882-97 to determine % elongation and modulus. The width and thickness of each sample were 0.5 inches and about 0.002 to 0.0025 inches, respectively. The specimen gauge length was 4 inches, the grip distance was 4 inches, and the crosshead speed was 2 inches/min. Results are shown in Table 2.

TABLE 2

| Example | Cure Temp. (° C.) | Cure Time (min.) | Cure atmosphere | % Elongation | Modulus (kpsi) |
|---|---|---|---|---|---|
| 4-1 | 130 | 30 | air | >150 | 23.5 |
| 5-1 | 130 | 30 | air | >150 | 21.8 |
| 4-2 | 175 | 60 | nitrogen | >150 | 17.8 |
| 5-2 | 175 | 60 | nitrogen | 125 | 22.4 |
| 4-3 | 225 | 60 | nitrogen | >125 | 16.6 |
| 5-3 | 225 | 60 | nitrogen | 85 | 28.9 |

The tensile results show that the introduction of the free radical initiator in addition to the cationic initiator results in a higher modulus when the cross-linkable adhesive precursor is cured at a temperature, which activates the free radical initiator (>150° C.). It also results in lower elongation. Both phenomena are indicative of greater free radical crosslinking of the base epoxidized aromatic-diene block copolymer through residual vinyl functionality compared to the cross-linkable adhesive precursor cured only cationically through the epoxy functionality.

Although the present invention has been described with reference to preferred embodiments, workers skilled in the art will recognize that changes may be made in form and detail without departing from the spirit and scope of the invention.

The invention claimed is:

1. A circuit article for use with an inkjet printer pen, the circuit article comprising:
    a flexible circuit having a plurality of conductive traces disposed on a dielectric film;
    an adhesive film disposed adjacent the dielectric film of the flexible circuit, the adhesive film being derived from a cross-linkable precursor comprising an epoxidized aromatic-diene block copolymer and a thermal-curing agent; and
    a carrier film disposed adjacent the adhesive film, opposite of the flexible circuit.

2. The circuit article of claim 1, wherein the epoxidized aromatic-diene block copolymer comprises an epoxidized styrene-butadiene block copolymer.

3. The circuit article of claim 2, wherein the epoxidized styrene-butadiene block copolymer comprises about 30% by weight to about 80% by weight epoxidized butadiene block.

4. The circuit article of claim 1, wherein the epoxidized aromatic-diene block copolymer has an epoxy equivalent weight ranging from about 100 to about 2,200.

5. The circuit article of claim 1, wherein the thermal-curing agent comprises a quaternary hexafluoroantimonate salt.

6. The circuit article of claim 1, wherein the carrier film comprises a material selected from the group consisting of poly(ethylene naphthalate), poly(ethylene terephthalate, polyaramids, polyimides, and combinations thereof.

7. The circuit article of claim 1, wherein the carrier film is treated with a treatment technique selected from the group consisting of flash lamp treatments, corona treatments, plasma treatments, flame treatments, chemical treatments, and combinations thereof.

8. The circuit article of claim 1, further comprising an adhesive tie layer disposed adjacent the carrier film, opposite the adhesive film.

9. The circuit article of claim 1 wherein the thermal curing agent is a cationic curing agent.

10. The circuit article of claim 9 wherein the thermal curing agent further comprises a free radical curing agent.

11. The circuit article of claim 10, wherein the free radical curing agent is a peroxide.

12. The circuit article of claim 10, wherein the free radical curing agent is dicumyl peroxide.

13. An inkjet printer pen comprising:
    a pen body configured to store and dispense ink;
    a carrier film adhered to the pen body;
    an adhesive film disposed adjacent the carrier film, opposite the body, wherein the adhesive film is derived from a cross-linkable precursor comprising an epoxidized aromatic-diene block copolymer and a thermal-curing agent;
    a flexible circuit having a plurality of conductive traces disposed on a dielectric film, the dielectric film being disposed adjacent the adhesive film.

14. The inkjet printer pen of claim 13, wherein the epoxidized aromatic-diene block copolymer comprises an epoxidized styrene-butadiene block copolymer.

15. The inkjet printer pen of claim 13, wherein the epoxidized aromatic-diene block copolymer has an epoxy equivalent weight ranging from about 100 to about 2,200.

16. The inkjet printer pen of claim 13, wherein the thermal-curing agent comprises a quaternary hexafluoroantimonate salt.

17. The inkjet printer pen of claim 13, wherein the carrier film comprises a material selected from the group consisting of poly(ethylene naphthalate), poly(ethylene terephthalate, polyimides, polyaramid, and combinations thereof.

18. The inkjet printer pen of claim 13, wherein the carrier film is treated with a treatment technique selected from the group consisting of flash lamp treatments, corona treatments, plasma treatments, flame treatments, chemical treatments, and combinations thereof.

19. The inkjet printer pen of claim 13 wherein the thermal curing agent is a cationic curing agent.

20. The circuit article of claim 19 wherein the thermal curing agent further comprises a free radical curing agent.

21. The inkjet printer pen of claim 20, wherein the free radical curing agent is a peroxide.

22. The inkjet printer pen of claim 20, wherein the free radical curing agent is dicumyl peroxide.

* * * * *

UNITED STATES PATENT AND TRADEMARK OFFICE
CERTIFICATE OF CORRECTION

PATENT NO. : 7,871,150 B2  
APPLICATION NO. : 11/624638  
DATED : January 18, 2011  
INVENTOR(S) : Ronald L Imken Page 1 of 1

It is certified that error appears in the above-identified patent and that said Letters Patent is hereby corrected as shown below:

On the Title Page
insert -- Item (60) Related U.S. Application Data U.S. patent application Ser. No. 11/334,892, filed January 19, 2006 --, therefore.

On the Title Page
Item (74), Attorney, Agent, or Firm, delete "Malania G. Gover" and insert -- Melanie G. Gover --, therefore.

Column 6
Line 50, delete "sulfoninum" and insert -- sulfonium --, therefore.
Line 50, delete "quartemary" and insert -- quarternary --, therefore.
Line 51, delete "daryliodonium" and insert -- diaryliodonium --, therefore.
Line 52, delete "trifilic" and insert -- triflic --, therefore.
Line 53, delete "$BF_3.H_2C_2H_5OH$" and insert -- $BF_3 \cdot H_2C_2H_5OH$ --, therefore.

Column 12
Line 1, delete "butyroactone" and insert -- butyrolactone --, therefore.

Column 14
Line 5, after "terephthalate" insert -- ) --, therefore.
Line 47, in Claim 17, after "terephthalate" insert -- ) --, therefore.

Signed and Sealed this  
Nineteenth Day of July, 2011

David J. Kappos  
*Director of the United States Patent and Trademark Office*